(12) United States Patent
Chao et al.

(10) Patent No.: US 7,169,626 B2
(45) Date of Patent: Jan. 30, 2007

(54) METHOD FOR DETECTING ALIGNMENT MARK SHIELDING

(75) Inventors: Yen-Chang Chao, Taichung (TW); You-Hua Chou, Taipei (TW); Yong-Ping Chan, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 48 days.

(21) Appl. No.: 10/944,844

(22) Filed: Sep. 21, 2004

(65) Prior Publication Data
US 2006/0063347 A1 Mar. 23, 2006

(51) Int. Cl.
*H01L 31/26* (2006.01)

(52) U.S. Cl. ................ 438/14; 438/401; 257/E21.521

(58) Field of Classification Search .......... 438/14–18, 438/401; 257/E21.521
See application file for complete search history.

(56) References Cited

U.S. PATENT DOCUMENTS

| | | | |
|---|---|---|---|
| 4,958,082 A * | 9/1990 | Makinouchi et al. ....... 250/548 |
| 5,320,728 A | 6/1994 | Tepman et al. | |
| 5,456,756 A * | 10/1995 | Ramaswami et al. ....... 118/721 |
| 5,614,446 A | 3/1997 | Chan et al. | |
| 6,277,658 B1 * | 8/2001 | Jeng et al. ................. 438/14 |
| 6,492,269 B1 * | 12/2002 | Liu et al. .................. 438/687 |

* cited by examiner

*Primary Examiner*—Brook Kebede
(74) *Attorney, Agent, or Firm*—Birch, Stewart, Kolasch & Birch, LLP

(57) ABSTRACT

A method of testing a test wafer includes shielding test centers on a test wafer using shielding tabs during the deposition of a layer. The test wafer has the same size and shape of product wafers. The shielding tabs are then removed from the test wafer. A plurality of predetermined points which are separated from each test center by a critical interval are checked, and whether each point is covered by the layer is determined through an interferometer or a microprobe. The test wafer is processed after adjustments to or maintenance on equipment, or after a fixed number of product wafers have been processed.

20 Claims, 7 Drawing Sheets

METHOD FOR DETECTING ALIGNMENT MARK SHIELDING

BACKGROUND

The present invention relates to a method for preserving alignment marks, and more particularly for a method used to monitor the use of clamp ring shielding tabs to preserve alignment marks by shielding the alignment marks during deposition of material on a wafer.

The preservation of alignment marks during the deposition of layers of material on a wafer is of primary importance in photolithographic processing of integrated circuit wafers of the background art. One method used to preserve the alignment marks is to place shielding tabs on the clamp ring used to hold the wafer in place during material deposition. The effectiveness of the shielding tabs depends on the location of the shielding tabs when material is deposited, and continual monitoring of this location is important.

U.S. Pat. No. 5,456,756 to Ramaswami et al. and U.S. Pat. No. 5,614,446 to Ramaswami et al., the entirety of each which are hereby incorporated by reference, describe the use of shielding tabs on the clamp ring used to hold wafers in place during material deposition to shield the alignment marks during material deposition. This shielding prevents material from being deposited over the alignment marks and obscuring the alignment marks.

U.S. Pat. No. 5,320,728 to Tepman, the entirety of which is hereby incorporated by reference, describes a planar magnetron sputtering source used to produce a uniform coating of material during material deposition on a wafer. U.S. Pat. No. 6,277,658 to Jeng et al., the entirety of which is hereby incorporated by reference, describes a method of using a monitor wafer with alignment marks to monitor the shielding of alignment marks during material deposition steps.

FIG. 1A shows a top view of an oxide wafer 10, used as a test wafer, having monitor marks 12 formed thereon. The test wafer 10 has the same size and shape as a product wafer and also has the alignment notch 14. The monitor marks 12 are larger than the alignment marks 14 on the product wafer, but the center of the monitor marks 12 are at the same location on the test wafer 10 as the center of the alignment marks on the product wafer. In this example, the alignment marks 12 have the shape of a star. FIG. 1B shows a top view of the clamping ring 20 assembled to the test wafer 10, showing that each shielding tab 22 covers most, but not all, of one of the monitor marks 12.

FIG. 2A shows the star-like monitor marks 12 on the test wafer 10 described with respect to the method of the background art. The monitor marks 12 include a plurality of squares 16 with the same intervals and a mark center 17, which has the same location as the center of the alignment mark on the product wafers. FIG. 2B shows top views of a part of a test wafer 10 after a layer of opaque material 19 has been deposited on the test wafer 10 and the clamp ring has been removed. In FIG. 2B, part of the monitor marks 12 are covered by the deposited material 19. The center square 17 of the monitor mark is well centered in the space protected by the shielding tabs of the clamp ring as can be seen by observing the monitor squares 16 around the center square 17. The monitor squares 16 surrounding the center square 17 can be used to determine the minimum distance 192 to the edge 191 of the deposited material 19. If the minimum distance 192 is greater than a critical distance, the location of the shielding tabs in relation to the oxide test wafer is acceptable and the processing of product wafers can continue.

If the minimum distance 192 is less than or equal to the critical distance, as shown in FIG. 2C, the location of the shielding tabs in relation to the oxide test wafer is not acceptable and corrective action must be taken before the processing of product wafers is continued. However, the aforementioned method of the background art requires specific masks and specific processes to form the monitor marks on the test wafers, thus increasing the cost of the test wafers. Furthermore, the minimum distance can only be approximately determined by counting the monitor marks shown on a monitor, such that the counting results are usually unreliable and easily causes fault operations. Hence, the present inventor has determined that there is a need for a better method that can overcome the aforementioned problems of the background art.

SUMMARY

The present invention overcomes the shortcomings associated with the background art and achieves other advantages not realized by the background art.

An object of the invention is to provide a reliable and effective method of using a test wafer without any monitor marks formed thereon to test the alignment of the shielding tabs to the alignment marks and/or to save the cost of fabricating the monitor wafers.

One or more of these and other objects are accomplished by a method of monitoring the shielding of alignment marks, comprising the steps of providing a plurality of product wafers, wherein each of the product wafers has a plurality of alignment marks, and each alignment mark has a mark center; providing a clamp ring having shielding tabs, wherein the clamp ring holds the product wafers in place during processing steps depositing a material on the product wafers so that the shielding tabs cover the alignment marks on the product wafers; providing a plurality of test wafers having the same size and shape as the product wafers, wherein a plurality of test centers are defined on the test wafers, and the test centers have the same location on the test wafers as the centers of the alignment marks on the product wafers; selecting the material for deposition; selecting a first test wafer from the test wafers; placing the clamp ring on the first test wafer so that the shielding tabs cover the test centers on the first test wafer; depositing a layer of the selected material on the first test wafer after the clamp ring has been placed on the first test wafer; removing the clamp ring from the first test wafer after depositing the layer of the selected material on the first test wafer; providing a detecting device; determining whether a first, a second and a third point are covered by the layer of the selected material deposited on the first test wafer through the detecting device, wherein the first, second and third points are separated from a first test center by a critical interval, the first point is located between the center of the first test wafer and the first test center, and the second and third points are located at either side of a first line perpendicular to a first radius passing through the first test center; and taking corrective action if any of the first, second and third points is covered by the layer of the selected material.

One or more of these and other objects are further accomplished by a method of monitoring the shielding of alignment marks, comprising providing a plurality of product wafers, wherein each of the product wafers has a plurality of alignment marks, and each alignment mark has a mark center; providing a clamp ring having shielding tabs, wherein the clamp ring holds the product wafers in place during processing steps depositing a selected material on the product wafers so that the shielding tabs cover the alignment marks on the product wafers; placing the clamp ring on each of a first number of the product wafers, wherein the alignment marks of each of the wafers are covered by the shielding tabs of the clamp ring placed on that wafer; depositing a layer of the selected material on the first number of product wafers after placing the clamp ring on the first number of product wafers; providing a test wafer having the same size and shape as the product wafers, wherein a plurality of test centers are defined on the test wafer, and the test centers have the same location on the test wafer as the centers of the alignment marks on the product wafers; placing the clamp ring on the test wafer so that the shielding tabs cover the test centers on the test wafer; depositing a layer of the selected material on the test wafer after the clamp ring has been placed on the test wafer; removing the clamp ring from the test wafer after depositing the layer of the selected material on the test wafer; providing a detecting device; determining whether a first, a second and a third point are covered by the layer of the selected material deposited on the first test wafer through the detecting device, wherein all the first, second and third points are separated from a first test center by a critical interval, the first point is located between the center of the first test wafer and the first test center, and the second and third points are located at either side of a first line perpendicular to a first radius passing through the first test center; and taking corrective action if any of the first, second and third points is covered by the layer of the selected material.

One or more of these and other objects are further accomplished by a method of monitoring the shielding of alignment marks, comprising providing a test wafer having a deposited layer of a selected material, wherein a plurality of test centers are defined on the test wafer; providing a clamp ring having shielding tabs, wherein the clamp ring holds the product wafers in place during processing steps covering the test centers of the test wafer; depositing a layer of a selected material on the test wafer after placing the clamp ring on the test wafer; providing a detecting device; determining whether a first, a second and a third point are covered by the layer of the selected material deposited on the test wafer through the detecting device, wherein all of the first, second and third points are separated from a first test center by a critical interval, the first point is located between the center of the first test wafer and the first test center, and the second and third points are located at either side of a first line perpendicular to a first radius passing through the first test center; and taking corrective action if any of the first, second and third points is covered by the layer of the selected material.

The present invention provides a method of monitoring the shielding of alignment marks. First, a plurality of test wafers having the same size and shape as the product wafers are provided. A plurality of test centers are defined on the test wafers, and the test centers have the same location on the test wafers as the centers of the alignment marks on the product wafers. A clamp ring with shielding tabs is placed on the test wafer so that the shielding tabs cover the test centers on the test wafer. After depositing a layer of the selected material on the test wafer, the clamp ring is removed from the test wafer. Next, a plurality of predetermined points which are separated from each test center by a critical interval are checked, and whether each point is covered by the layer of the selected material is determined by an interferometer or a microprobe. Finally, adjustments to deposition equipments are preceded if any of the predetermined points is covered by the layer of the selected material.

In a preferred embodiment, the layer is made of opaque material, such as metal. Thus, no interfering signal can be detected by the interferometer 40 at the predetermined point, which has an additional deposited layer covering thereon.

In another preferred embodiment, the layer is made of opaque material, such as metal. Whether each predetermined point is covered by the layer of the selected material can be determined through the resistance thereof by a microprobe.

Moreover, each of the test centers has three predetermined test points nearby. The predetermined points are separated from the test centers by a critical interval, such as a first point is located between the center of the test wafer and a first test center point, a second and a third point are located at the either side of the line perpendicular to the radius passing through the test center.

Moreover, a first test center and a second test center are located on the same diameter. The critical distance is between 0.2 and 0.5 times of the width of the shielding tabs, such as between 2 and 5 mm.

In a preferred embodiment, the test wafers are oxide wafers. The test wafer is subjected to the same processing steps prior to the deposition of the layer of the selected material on the test wafer as the product wafers prior to the deposition of the layer of the selected material on the product wafers. The test wafers are processed after maintenance on equipment or after a fixed number of product wafers, such as one thousand pieces, are processed. The deposition processes of the product wafers are preceded when none of the predetermined test points of the test wafer is covered by the layer of the selected material.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DESCRIPTION

Figure 1A:
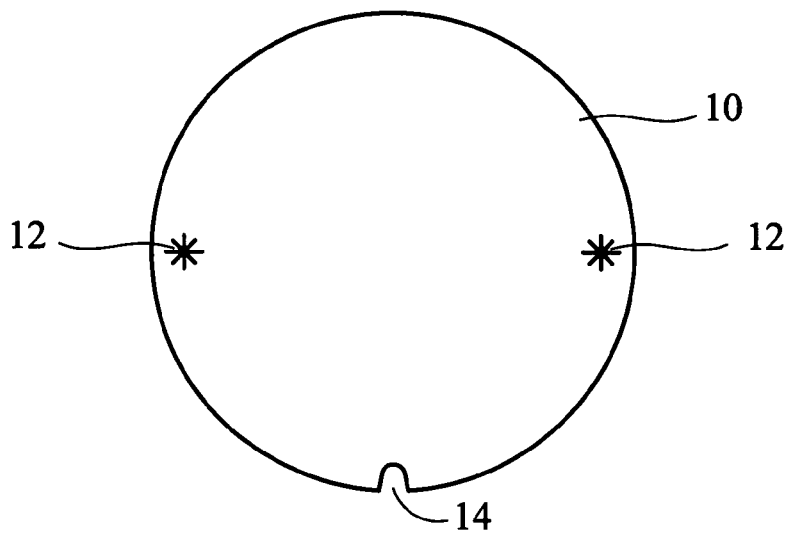
FIG. 1A is a top view of a test wafer of the background art with monitor marks.
Figure 1B:
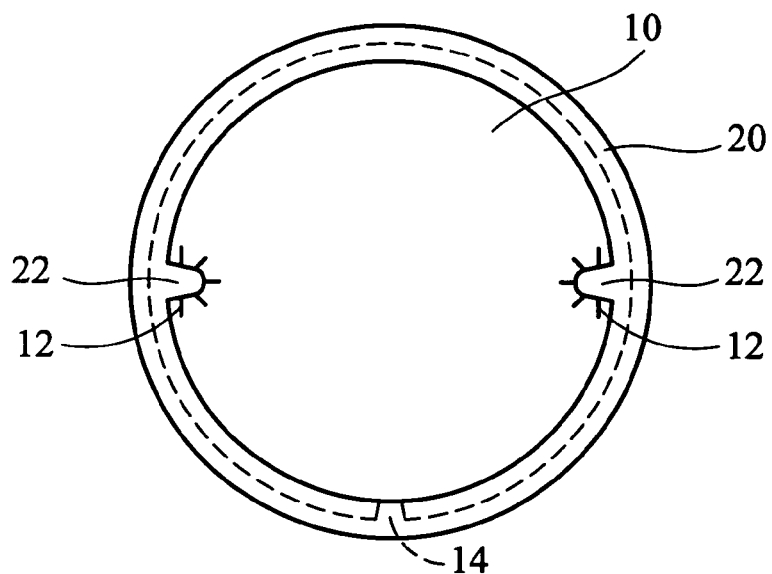
FIG. 1B is a top view of a clamping ring assembled with a test wafer of the background art.
Figure 2A:
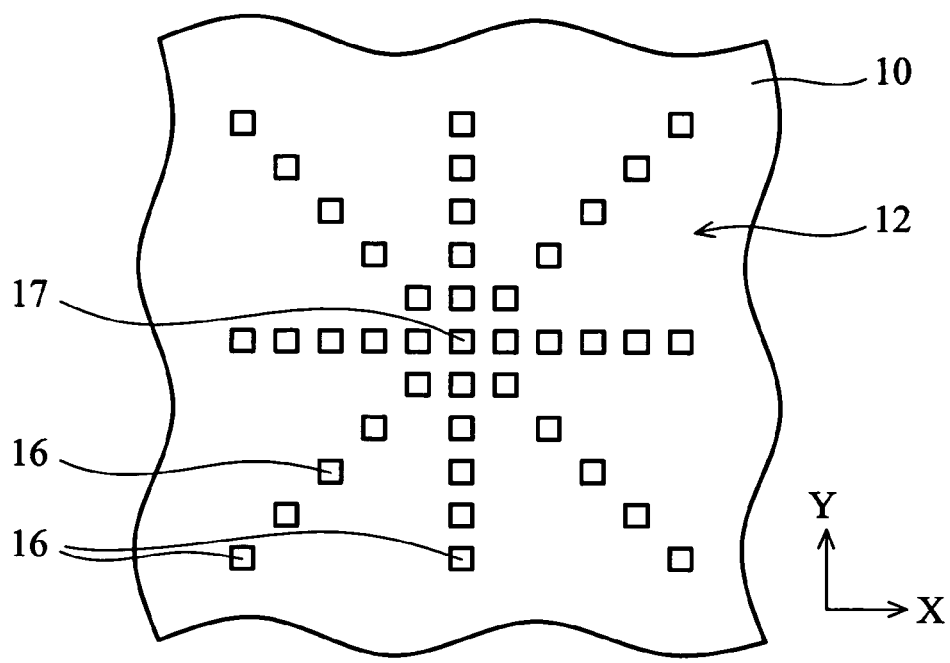
FIG. 2A is an enlarged view of a monitor mark on the test wafer of the background art.
Figure 2B:
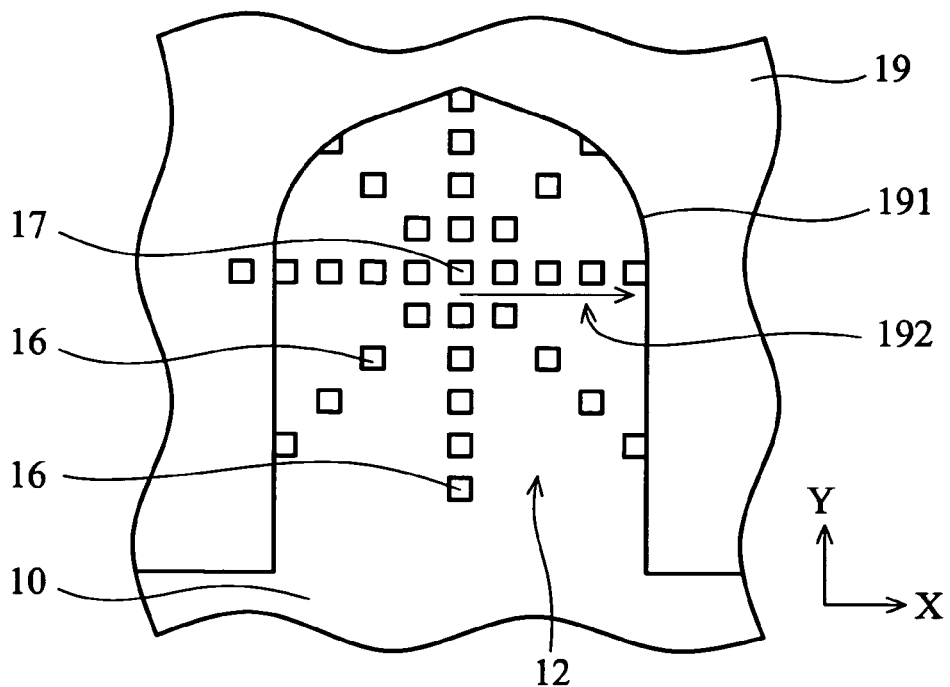
FIG. 2B shows a monitor mark on a test wafer of the background art after deposition of an opaque material when there is proper alignment between the monitor mark and the shielding tabs.
Figure 2C:
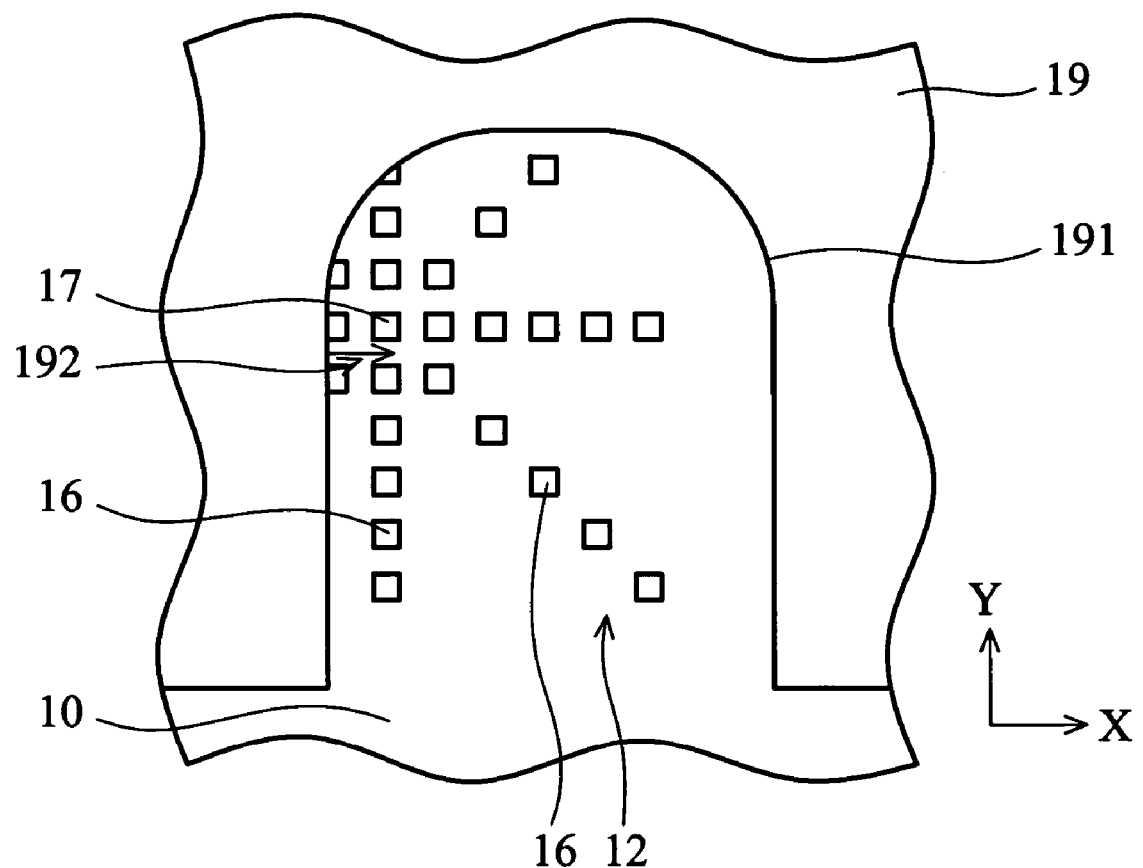
FIG. 2C shows a monitor mark on a test wafer of the background art after deposition of an opaque material when there is proper alignment between the monitor mark and the shielding tabs in the Y direction, but improper alignment between the monitor mark and the shielding tabs in the X direction.
Figure 3A:
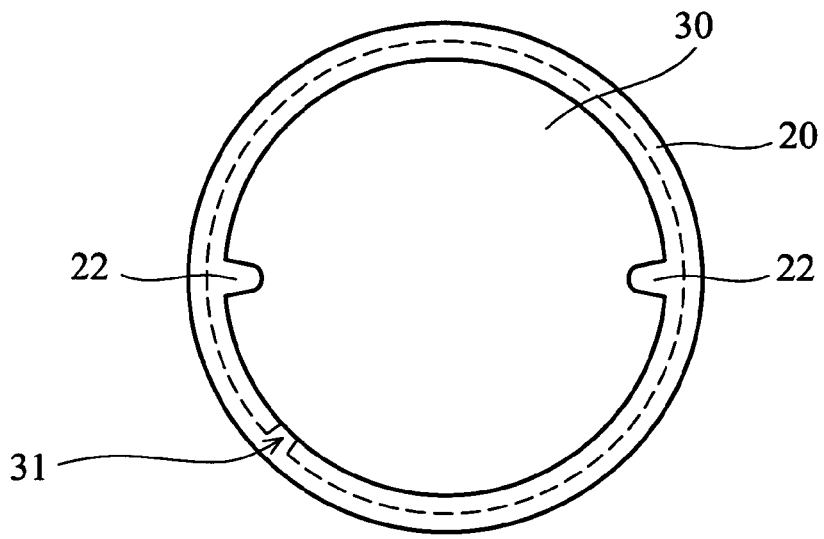
FIG. 3A is a top view of a clamping ring assembled with a test wafer according to an embodiment of the present invention.

The present invention will hereinafter be described with reference to the accompanying drawings. FIG. 3A is a top view of a clamping ring assembled with a test wafer according to an embodiment of the present invention. In FIG. 3A, a oxide wafer is used as a test wafer 30 to precede the following test method. The test wafer 30 has the same size and shape as the product wafers and is clamped by a clamp ring during the deposition process. The test wafer 30 has an alignment notch 31, but no alignment marks as described in the background art. A plurality of test centers, two in this example, are defined on the test wafer. The test center has the same location on each test wafer 30 as the centers of the alignment marks on the product wafers. The test centers are defined according to the relative position of the alignment notch 31 and can be preserved by the shielding tabs 22 of the clamp ring 20.

Figure 3B:
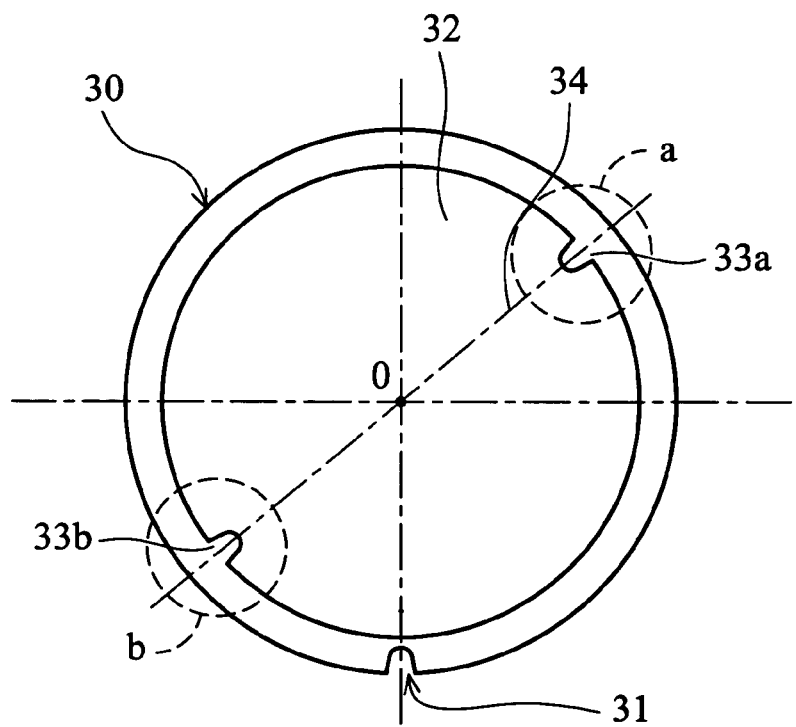
FIG. 3B is a top view of the test wafer in FIG. 3A after a deposition process.

FIG. 3B is a top view of the test wafer in FIG. 3A after a deposition process. The test wafer 30 is subjected to the same processing steps prior to the deposition of the layer of a selected material, such as a metal or an oxide layer, on the test wafer 30 as the product wafers prior to the deposition of the layer of the selected material on the product wafers. After the clamp ring has been removed, a layer of material 32 has been deposited on the test wafer 30 and two uncovered regions 33a, 33b are shown in FIG. 3B.

Figure 4A:
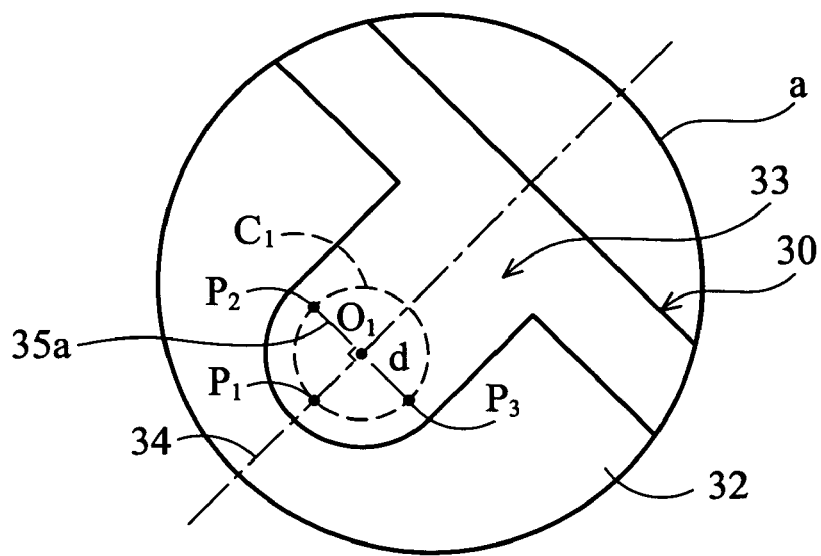
FIG. 4A is an enlarged view of area (a) in FIG. 3B showing three predetermined test points according to the present invention.
Figure 4B:
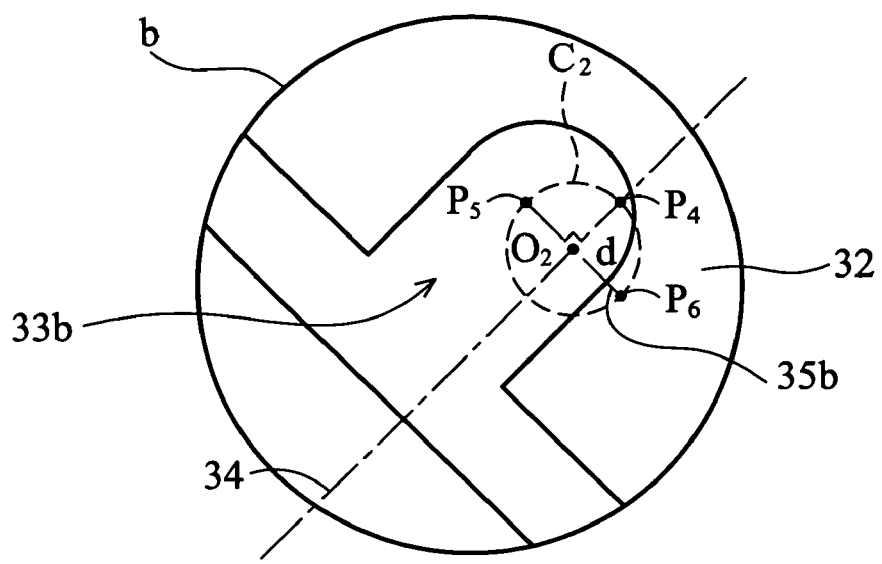
FIG. 4B is an enlarged view of area (b) in FIG. 3B showing another three predetermined test points according to the present invention.

FIG. 4A is an enlarged view of area (a) in FIG. 3B showing three predetermined test points according to the present invention. FIG. 4B is an enlarged view of area (b) in FIG. 3B showing another three predetermined test points according to the present invention.

FIG. 4A is an enlarged view of the uncovered region showing a test center and three predetermined test points. The first test center $O_1$ has the same location on each test wafer 30 as the center of a first alignment mark on the product wafers. Three predetermined points $P_1$-$P_3$, or any point on circle $C_1$, separated from the first test center $O_1$ by a critical interval (d) should be tested by a detecting device to ensure all of the test points are not covered by the deposited layer, and the shielding masks of the clamp ring is assembled on the correct position to protect alignment marks on the product wafers. The first test point $P_1$ is located on the diameter 34 between the center of the test wafer and the first test center $O_1$. The second $P_2$ and third points $P_3$ are located at the either side of a line 35a perpendicular to the diameter 34 passing through the first test center $O_1$. In FIG. 4A, all of the three predetermined test points are not cover by the deposited layer, which means that the position of this shielding tab is acceptable, and the first test point, or the relative alignment mark on the product wafers can be preserved after the deposition process. Thus, the processing of product wafers can continue.

FIG. 4B is an enlarged view of area (b) in FIG. 3B showing another three predetermined test points of the invention. Similarly, a second test center $O_2$ has the same location on each test wafer 30 as the center of a second alignment mark on the product wafers. In this example, the first test center $O_1$ and the second test center $O_2$ are located on the same diameter 34. Another three predetermined points $P_4$-$P_6$, or any point on the circle $C_2$, separated from the second test center $O_2$ by a critical interval (d) are tested by a detecting device to ensure all of the test points are not covered by the deposited layer 32. The fourth test point $P_4$ is located on the diameter 34 between the center of the test wafer and the second test center $O_2$. The fifth $P_5$ and sixth points $P_6$ are located at the either side of a line 35b perpendicular to the diameter 34 passing through the second test center $O_2$.

In FIG. 4B, the fourth $P_4$ and the fifth test points $P_5$ are not covered by the deposited layer 32, but the sixth test point $P_6$ is, which means that there is proper alignment between the second test center $O_2$ and the shielding tabs in the radial direction but poor alignment between the second test center $O_2$ and the shielding tabs in the tangent direction. The second test center $O_2$ is not well centered in the space protected by the shielding tabs of the clamp ring, and the relative alignment mark on the product wafers may be covered by the deposited layer.

In the example of FIG. 4B, corrective actions must be taken before the processing of product wafers is continued. Otherwise, if none of the predetermined test points on the test wafer is covered by the deposited layer, the deposition process on the product wafers are preceded. The critical distance (d) is between 0.2 and 0.5 times the width of the shielding tabs according to the reliability of the individual semiconductor equipment. The width of the conventional shielding tabs is about 10 mm, such that the critical interval is between 2 to 5 mm, and 4 mm is a preferred value. In FIG. 3B, the included angle between the alignment notch 31 and the diameter 34 passing through the first test center $O_1$ and the second test center $O_2$ is about 55°. The relative polar coordinates of the predetermined test points $P_1$-$P_6$ on an 8" test wafer, for example, are shown in the following Table.

TABLE 1

| Test Point | Polar Coordinates |
|---|---|
| $P_1$ | (90.99, 35°) |
| $P_2$ | (94.99, 37.41°) |
| $P_3$ | (94.99, 32.59°) |
| $P_4$ | (90.99, 215°) |
| $P_5$ | (94.99, 212.59°) |
| $P_6$ | (94.99, 217.41°) |

Figure 5A:
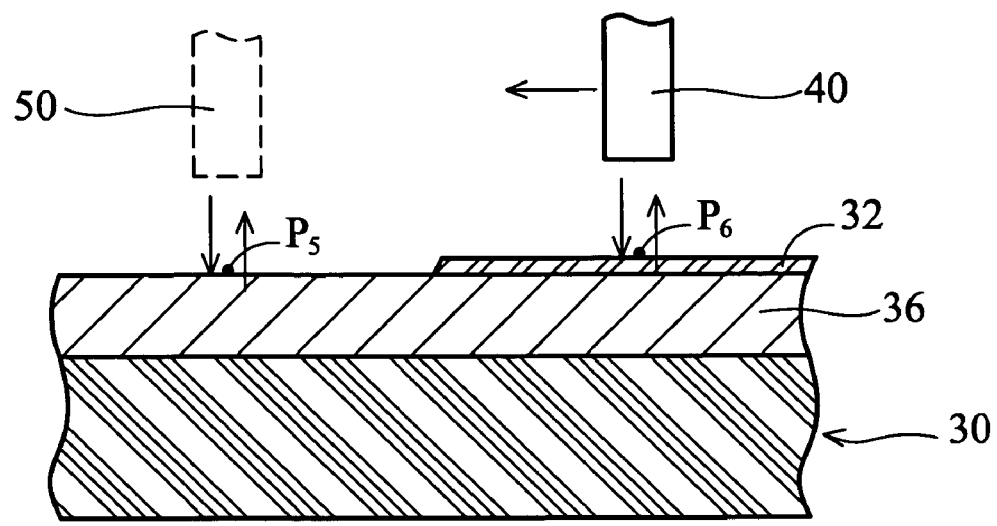
FIG. 5A shows an interferometer for detecting whether a deposited layer according to the present invention covers each test point.

In a preferred embodiment, an interferometer 40, or other optical detector, can be applied as a detecting device of the aforementioned method to detect whether each test point is covered by a deposited layer. In FIG. 5A, a layer of a selected material 32 is deposited on the thick oxide layer 36 of a test wafer 30. When the deposited layer 32 is made of opaque material, e.g., such as metal, the interferometer 40 receives an interfered reflected signal at the fifth test point $P_5$, thus determining the fifth test point $P_5$ is not covered by the deposited layer 32. After that, the interferometer 40 moves to the sixth test point $P_6$ and cannot receive any, or very weak, interfered signal at the sixth test point $P_6$, which has an additional deposited layer covering thereon. Thus, a corrective action must be taken before the processing of product wafers is continued.

Figure 5B:
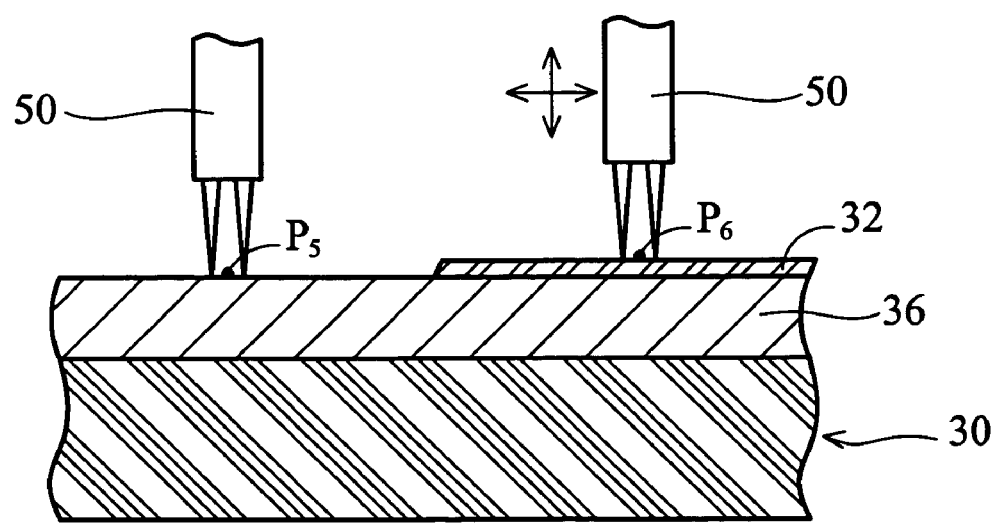
FIG. 5B shows a microprobe for detecting whether a metal layer according to the present invention covers each test point.

In another preferred embodiment, a resistance-type of microprobe 50 can be applied as a detecting device of the aforementioned method. In FIG. 5B, a layer of an opaque material 32, such as metal, is deposited on the oxide layer 36 of a test wafer 30. The microprobe 50 gats a large resistance at fifth test point $P_5$ but a specific small resistance at the sixth test point $P_6$, which means the sixth test point $P_6$ is covered by a metal film 32 but the fifth test point $P_5$ is not. Thus, a corrective action must be taken before the processing of product wafers is continued.

Figure 6:
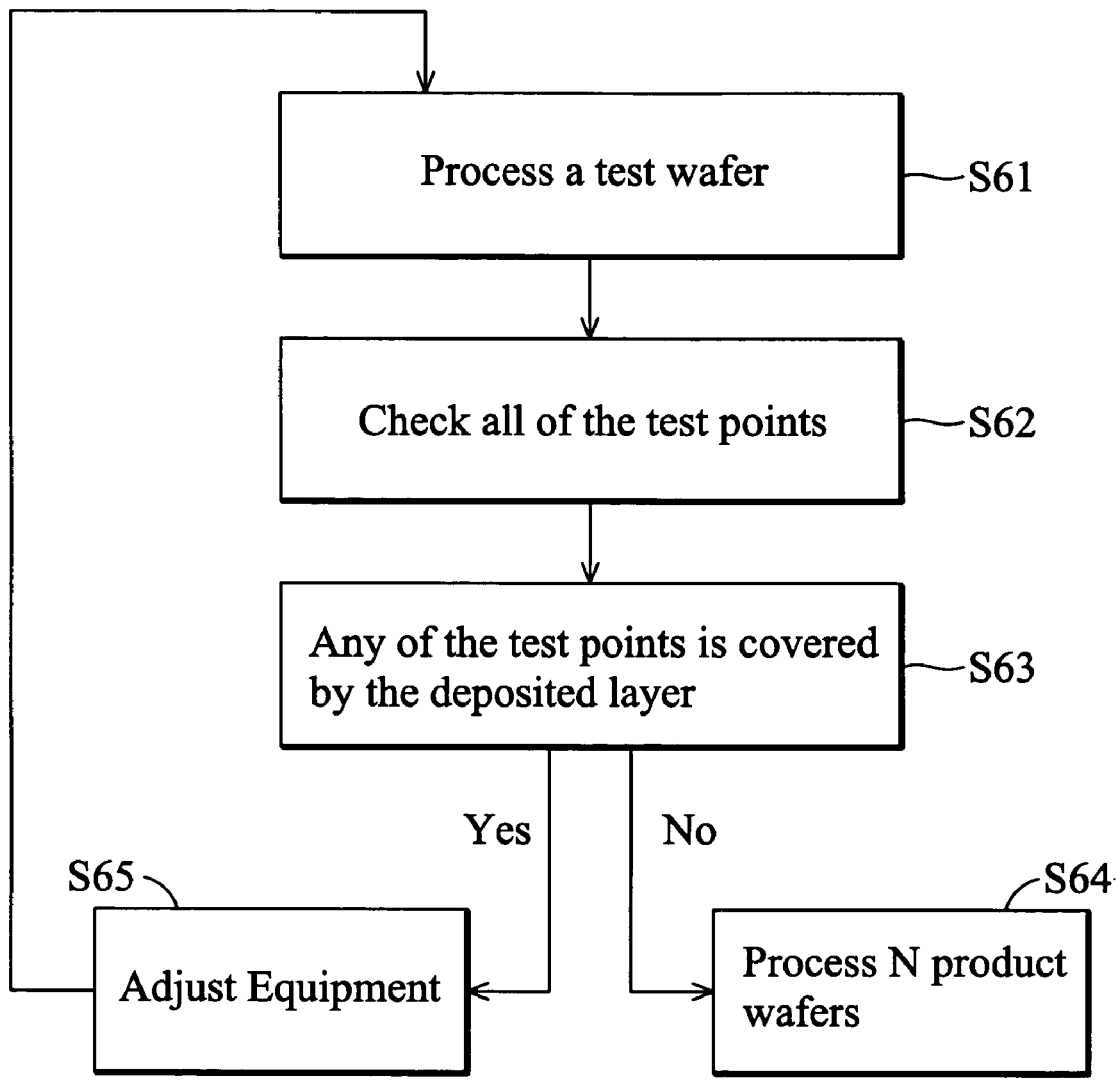
FIG. 6 is a block diagram showing a test wafer utilized as a process control for product wafers according to the present invention.

FIG. 6 is a block diagram showing a test wafer utilized as a process control for product wafers according to the present invention. The processing of the oxide test wafer is the same as the product wafers. The oxide test wafers are processed after changes to or maintenance of the processing equipment to assure proper operation before processing product wafers. The test wafers can also be used as a process control as shown by the block diagram in FIG. 6.

As shown in FIG. 6, a test wafer is processed exactly as the product wafers (S61). Next, whether each of the predetermined test points is covered by the layer of the selected material is determined by the detecting device (S62). Next, if none of the predetermined test points is covered by the layer of the selected material, a number of product wafers are processed, in this example about one thousand product wafers, and then another test wafer is processed (S64). If any of the predetermined test points is covered by the layer of the selected material, the equipment must be adjusted and another test wafer processed before processing product wafers (S65).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for adjusting semiconductor processing equipment, comprising:
    providing a lot of product wafers, wherein each of the product wafers has a plurality of alignment marks, and each alignment mark has a mark center;
    providing a test wafer having the same size and shape as the product wafers, wherein a plurality of test centers are defined on the test wafer, and the test centers have the same location on the test wafer as the mark centers on the product wafers;
    providing a clamp ring having shielding tabs, wherein the clamp ring holds the test wafer so that the shielding tabs cover the test centers;
    depositing a layer on the test wafer;
    removing the clamp ring from the test wafer;
    determining whether a first, a second and a third point are covered by the layer, wherein all the first, second and third points are separated from a first test center by a critical interval, the first point is located on a first diameter between the center of the test wafer and the first test center, and the second and third points are located at either side of a first line perpendicular to the first diameter passing through the test center;
    taking corrective action if any of the first, second and third points is covered by the layer;
    determining whether the fourth point, a fifth point and a sixth point are covered by the layer, wherein all of the fourth, fifth and sixth points are separated from a second test center by the critical interval, the fourth point is located on a second diameter between the center of the test wafer and the second test center, and the fifth and sixth points are located at either side of a second line perpendicular to a second diameter passing through the second test center;
    taking corrective action if any of the fourth, fifth and sixth points is covered by the layer; and
    processing the lot of product wafers if the first, second, third, fourth, fifth and sixth points of the first test wafer are not covered by the layer.

2. The method according to claim 1, wherein the critical distance is between 0.2 and 0.5 times of the width of the shielding tabs.

3. The method according to claim 1, wherein the critical distance is between 2 and 5 millimeters long.

4. The method according to claim 1, wherein the layer is opaque.

5. The method according to claim 1, wherein the layer is metal.

6. A method of testing a test wafer, comprising:
    providing a test wafer;
    defining a test center on the test wafer;
    shielding the test center of the test wafer;
    depositing a layer on the test wafer;
    exposing the test center;
    providing a detecting device, including microprobes to detect the resistance of a first, second, or third point covered by the layer;
    determining whether the first point is covered by the layer through the detecting device, wherein the first point is separated from the test center by a critical interval.

7. The method according to claim 6, wherein the first point is selected from any point on circle separated from the test center by the critical interval.

8. The method according to claim 7, wherein the first point is located on a diameter between the center of the test wafer and the test center.

9. The method according to claim 8, further comprising:
    determining whether the second and the third point are covered by the layer through the detecting device, wherein the second and third points are separated from the test center by the critical interval, and the second and third points are located at either side of a first line perpendicular to the diameter passing through the test center.

10. The method according to claim 6, wherein the layer is opaque.

11. The method according to claim 6, wherein the layer is metal.

12. The method according to claim 9, wherein the detecting device includes interferometer to detect the interference of reflected light of the first, second, or third points.

13. A method for adjusting semiconductor processing equipment, comprising:
    providing a lot of product wafers, wherein each of the product wafers has a plurality of alignment marks, and each alignment mark has a mark center;
    providing a test wafer having the same size and shape as the product wafers, wherein a plurality of test corners are defined on the test wafer, and the test centers have the same location on the test wafer as the mark centers on the product wafers;

providing a clamp ring having shielding tabs, wherein the clamp ring holds the test wafer so that the shielding tabs cover the test centers;

depositing a layer on the test wafer, removing the clamp ring from the test wafer;

determining whether a first, a second and a third point are covered by the layer, wherein all the first, second and third points are separated from a first test center by a critical interval, the first point is located on a first diameter between the center of the test wafer and the first test center, and the second and third points are located at either side of a first line perpendicular to the first diameter passing through the test center;

taking corrective action if any of the first, second and third points is covered by the layer;

determining whether the fourth point, a fifth point and a sixth point are covered by the layer, wherein all of the fourth, fifth and sixth points are separated from a second test center by the critical interval;

taking corrective action if any of the fourth, fifth and sixth points is covered by the layer, and processing the lot of product wafers if the first, second, third, fourth, fifth and sixth points of the first test wafer are not covered by the layer.

14. The method according to claim 13, wherein the fourth point is located on a second diameter between the center of the test wafer and the second test center, and the fifth and sixth points are located at either side of a second line perpendicular to a second diameter passing through the second test center.

15. The method according to claim 13, wherein the first diameter and the second diameter are the same.

16. The method according to claim 13, wherein the critical distance is between 0.2 and 0.5 times of the width of the shielding tabs.

17. The method according to claim 13, wherein the critical distance is between 2 and 5 millimeters long.

18. The method according to claim 13, wherein the layer is opaque.

19. The method according to claim 13, wherein the layer is metal.

20. The method according to claim 1, wherein the first diameter and the second diameter are the same.

* * * * *